United States Patent [19]
Yamamoto

[11] Patent Number: 6,024,478
[45] Date of Patent: Feb. 15, 2000

[54] DESIGN AIDING APPARATUS AND METHOD FOR DESIGNING A SEMICONDUCTOR DEVICE

[75] Inventor: Shigehisa Yamamoto, Tokyo, Japan

[73] Assignee: Mitsubishi Denki Kabushiki Kaisha, Tokyo, Japan

[21] Appl. No.: 08/761,901

[22] Filed: Dec. 9, 1996

[30] Foreign Application Priority Data

Jun. 10, 1996 [JP] Japan ................................ 8-147624

[51] Int. Cl.[7] .............................................. G01R 19/145
[52] U.S. Cl. .......................... 364/488; 364/489; 364/490; 364/491; 382/145
[58] Field of Search ................................. 364/488, 489, 364/490, 491; 382/145

[56] References Cited

U.S. PATENT DOCUMENTS 5,539,652  7/1996  Tegethoff ................................ 364/490
5,606,518  2/1997  Fang et al. ............................. 364/578
5,737,580  4/1998  Hathaway et al. ..................... 395/500

OTHER PUBLICATIONS

K. N. Quader et al, "A Bidirectional NMOSFET Current Reduction Model for Simulation of Hot–Carrier–Induced Circuit Degradation", IEEE Transactions of Electron Devices, vol. 40, No. 12, Dec. 1993, pp. 2245–2253.

Shiuh–Luen Wang, et al., Solid–State Electronics, vol. 36, No. 6, pp. 833–841, "Rely: A Physics–Based CAD Tool For Predicting Time–Dependent Hot–Electron Induced Degradation In Mosfet's", 1993.

*Primary Examiner*—Kevin J. Teska
*Assistant Examiner*—Thuan Do
*Attorney, Agent, or Firm*—Oblon, Spivak, McClelland, Maier & Neustadt, P.C.

[57] ABSTRACT

An electric work station calculates an output load of a selected cell based on information from at least one of a design cell information library, a logic circuit information library and a layout information library. The work station further calculates a hot carrier dependent lifetime of a transistor in the cell by using the computed output load and information from a reliability information library, and verifies reliability of the cell by comparing the calculated lifetime with a reference value.

18 Claims, 13 Drawing Sheets

DESIGN AIDING APPARATUS AND METHOD FOR DESIGNING A SEMICONDUCTOR DEVICE

BACKGROUND OF THE INVENTION

1. Field of the Invention

The present invention relates to a design aiding apparatus and a method for the design of semiconductor devices. To be more precise, the present invention relates to a reliability verifying tool and process serving as a design aiding apparatus and method for designing of semiconductor devices. In addition, the present invention also relates to a logic-circuit synthesizing tool and a process useful in the design of semiconductor devices. Similarly, the present invention relates to an automatic layout/wiring tool and process useful in the design of semiconductor devices.

2. Discussion of the Related Art

In recent years, a method for determining degradation caused by hot carriers in a MOS transistors forming a semiconductor device has been used in which hot carrier dependent lifetime of each transistor is calculated from real wave form data of inputs and outputs obtained from a known SPICE circuit simulation. Any transistor with a lifetime shorter than a predetermined reference value is determined to be a defective transistor.

Since this method uses a SPICE circuit simulation, it takes a very long simulation time to determine the defective transistors in a circuit of large scale with many such transistors. Further, a memory with a large storage capacity is required for storing wave form data of nodes of transistors for such a circuit.

Further, with conventional design aiding tools for providing semiconductor devices, such as a logic-circuit synthesizing tool or an automatic layout/wiring tool, the operational speed of a circuit being provided can be optimized, but the reliability of component transistors in terms of hot carrier degradation or the like is not taken into consideration, so that the circuit being provided may have poor reliability.

SUMMARY OF THE INVENTION

The present invention is intended to solve the problems encountered with conventional design aiding apparatus and methods for providing semiconductor circuits and devices as described above. Therefore, it is an object of the present invention to provide a design aiding apparatus and method for the design of semiconductor devices and circuits which provide for devices and circuits having a high degree of reliability that can be verified as to such reliability at a high speed. Moreover, such an apparatus and method provide for optimizing the operation of a designed circuit along with taking into consideration reliability with respect to hot carrier transistor degradation. It is a further object of the present invention to provide, as a design aiding apparatus and method for the designing of semiconductor devices, a tool and process for verifying device reliability, a tool and process for synthesizing logic-circuitry or a tool and process for performing automatic layout/wiring.

According to one aspect of the present invention, a design aiding apparatus for a semiconductor device, which device is made up of a plurality of basic design cells, comprises a design cell information library to aid in the designing of the semiconductor device, a logic-circuit information library to aid in the design of the semiconductor device, a layout information library to aid in the design of the semiconductor device, a reliability information library of cells, and a processing means for carrying out predetermined processing based on information from the libraries. The processing means can calculate an output load of a selected cell based on information from the design cell information library, the logic-circuit information library and the layout information library. The processing means can further calculate a hot carrier dependent lifetime of a transistor in the cell by using the calculated output load and information from the reliability information library, and, accordingly, verifies reliability of the cell by comparing the calculated lifetime with a predetermined reference value.

According to another aspect of the present invention, a design aiding apparatus for designing or synthesizing a semiconductor device, which includes a plurality of cells, comprises a logic-system information library for the semiconductor device, a propagation-delay information library for component cells, a reliability information library for component cells, and a processing means for carrying out predetermined processing based on information from the libraries. The processing means designs or synthesizes a logic circuit having a desired reference speed, based on information from the logic-system information library and the propagation-delay information library, wherein the cell lifetime of the designed logic circuit is determined to be better than that of a predetermined reference lifetime in terms of hot carrier degradation based on information obtained from the reliability information library.

According to one aspect of the present invention, a design aiding apparatus for the design of a semiconductor device, which includes a plurality of cells, comprises a design library of the semiconductor device, a layout information library of the semiconductor device, a reliability information library of cells, and a processing means for carrying out predetermined processing based on information from these libraries. The processing means sets wiring based on information from the layout information library, designs for a minimum device operating speed by using information from the design library, and performs automatic layout/wiring based on information from the reliability information library so as to have a cell expected lifetime free of the effects of hot carrier degradation.

In another aspect of the present invention, in the design aiding apparatus for the design of a semiconductor device, the reliability information library comprises an information library showing a relation between an output load of each cell and a hot-carrier dependent transistor lifetime, an information library showing a relation between input and output loads of each cell and a hot-carrier dependent transistor lifetime, or an information library showing a relation between a propagation delay from an input wave form to an output wave form of each cell and a hot-carrier dependent transistor lifetime.

In another aspect of the present invention, in the design aiding apparatus for the design of a semiconductor device, the information library, which shows a relation between a propagation delay from an input wave form to an output wave form of each cell and a hot-carrier dependent transistor lifetime, includes information on increases in propagation delay due to degradation caused by hot carriers.

According to another aspect of the present invention, in a design aiding method for the design of semiconductor devices, which include a plurality of cells, an output load of a selected cell is computed by using design cell information, logic circuit information and layout information. The hot-carrier dependent transistor lifetime of a selected cell is computed by using the computed output load and reliability information of the cell. This computed hot-carrier dependent transistor lifetime is compared with a predetermined minimum reference value, whereby the lifetime reliability of each cell is verified as being at least as long as that of the predetermined minimum reference value.

According to one aspect of the present invention, in a design aiding method for the design of semiconductor devices which include a plurality of cells, a logic circuit is provided by using logic system information and propagation-delay information so as to satisfy a desired operational speed requirement and by using reliability-lifetime information so as to include cells in the logic circuit which have a long life expectancy in terms of being designed to avoid hot carrier degradation and failure before some minimum time period has expired.

According to one aspect of the present invention, in a design aiding method for the design of semiconductor devices which include a plurality of cells, wiring layout is designed by using information from layout information, and automatic layout and/or wiring is performed by using reliability-lifetime information so as to include cells connected by the wiring which have a long life expectancy in terms of being designed to be free of hot carrier degradation effects for a long period of time and using design information of the semiconductor device so as to achieve a designed operational speed that, thus, can be maintained over this long period of time.

In another aspect of the present invention, in the design aiding method for the design of semiconductor devices, reliability information comprising information as to a relationship between an output load of each cell and a hot-carrier dependent transistor lifetime is stored and used, or reliability information comprising information as to a relationship between input and output loads of each cell and a hot-carrier dependent transistor lifetime is stored and used, or reliability information comprising information as to a relationship between a propagation delay from an input wave form to an output wave form of each cell and a hot-carrier dependent transistor lifetime is stored and used.

In another aspect of the present invention, in the design aiding method for the design of semiconductor devices, the reliability information comprising information as to a relationship between a propagation delay from an input wave form to an output wave form of each cell and a hot-carrier dependent transistor lifetime, which reliability information includes information on increases in propagation delay due to degradation caused by hot carriers, is stored and used.

BRIEF DESCRIPTION OF THE DRAWINGS

A more complete appreciation of the invention and many of the attendant advantages thereof will be readily understood by reference to the following detailed description when considered in connection with the accompanying drawings, wherein.

DETAILED DESCRIPTION OF THE PREFERRED EMBODIMENTS

Figure 1:
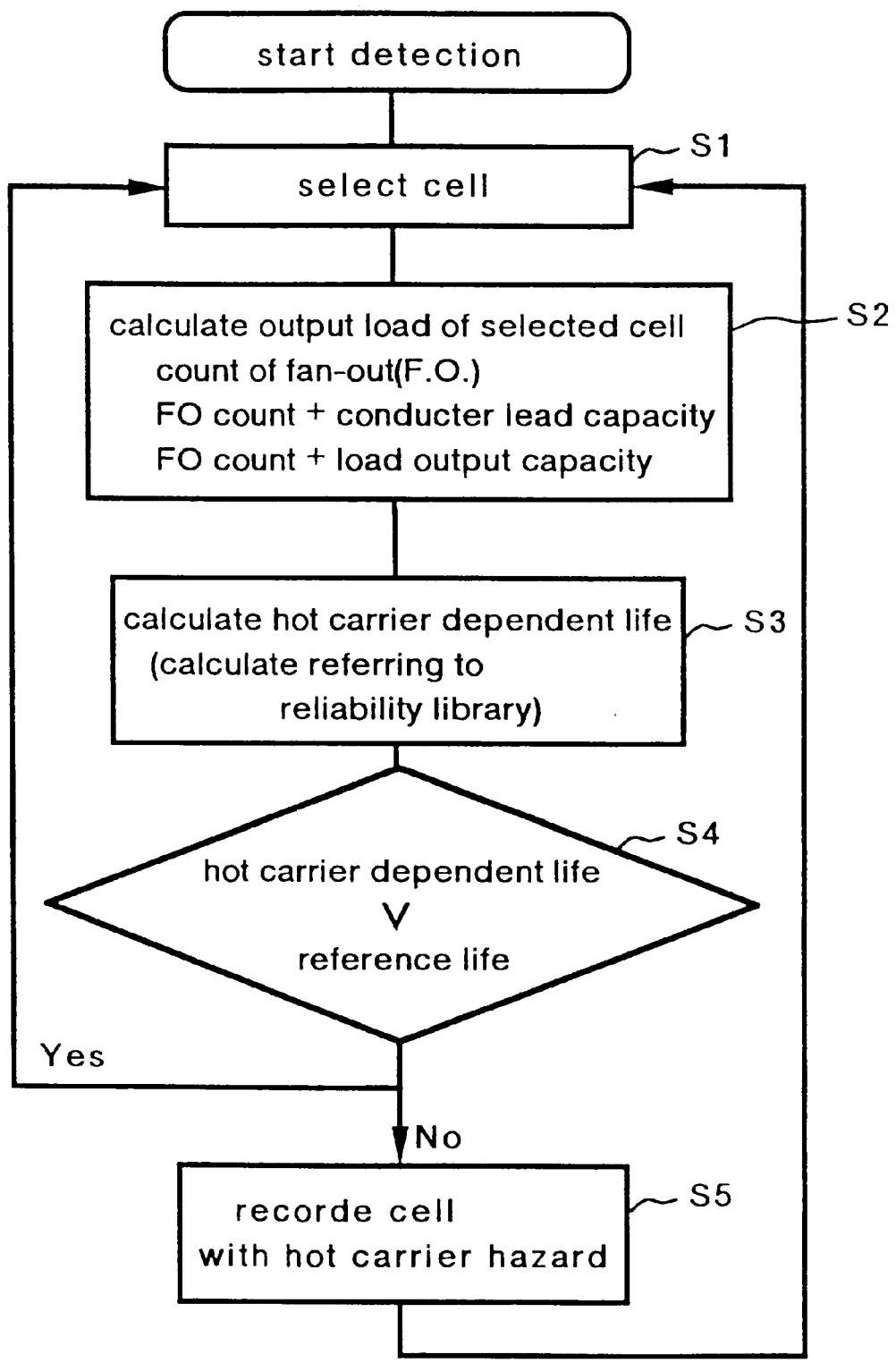
FIG. 1 shows a flowchart for explaining a design aiding apparatus and method, or more precisely, a reliability verifying tool and process to be used in the design of semiconductor devices according to a first embodiment of the present invention.

The present invention will become apparent from the following detailed description of the preferred embodiments with reference to the accompanying drawings showing the embodiments. Throughout the drawings, identical or corresponding elements are denoted by the same reference numerals.

First Embodiment

Figure 2:
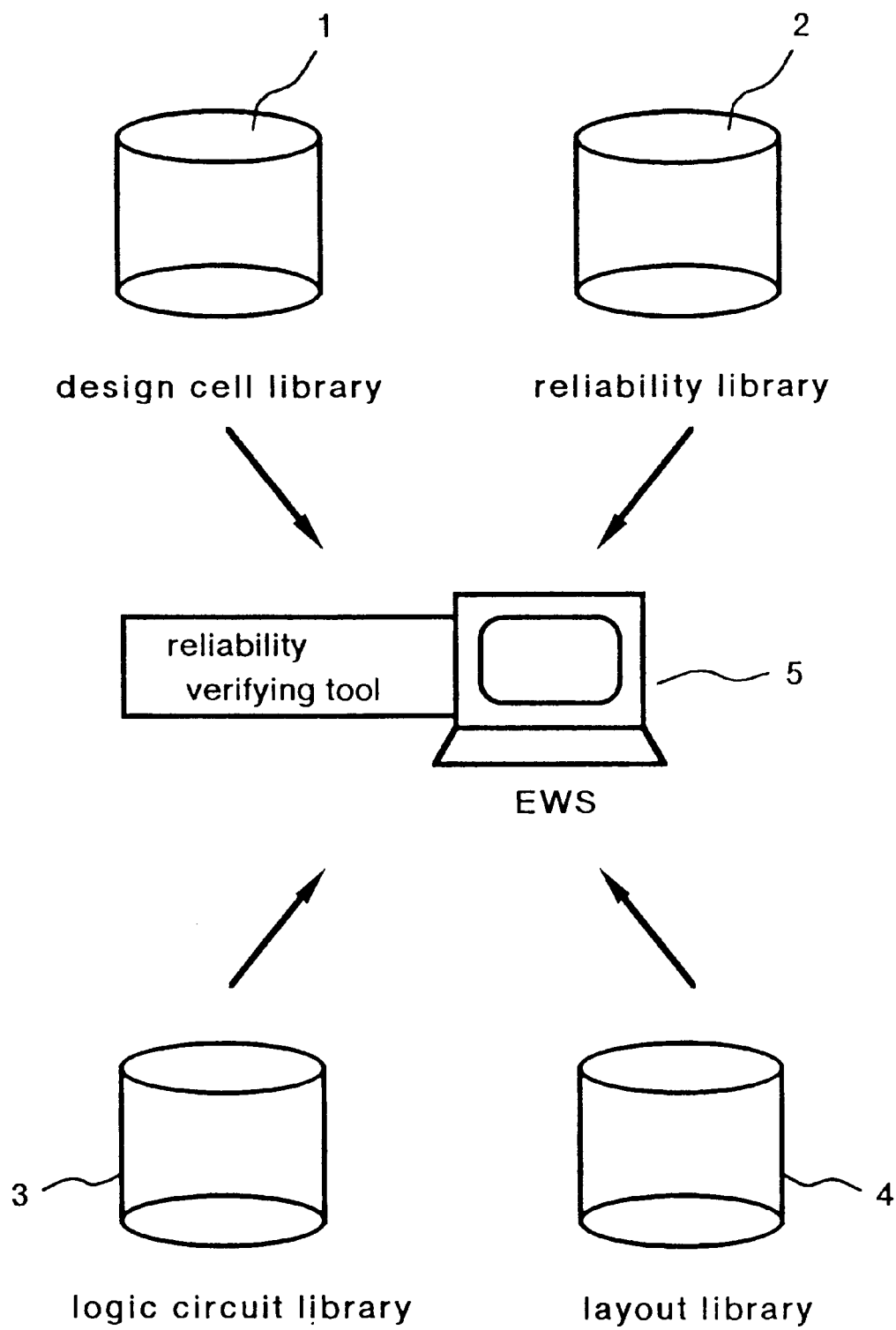
FIG. 2 is a view for explaining a configuration of the design apparatus, or more precisely, a reliability verifying tool to be used in the design of semiconductor devices according to the first embodiment of the present invention.

FIGS. 1 and 2 are views used for explaining a design aiding apparatus and method for designing semiconductor devices according to the first through third embodiments of the present invention. In more concrete terms, FIGS. 1 and 2 are views used for explaining a tool and method for verifying the reliability of a semiconductor device being designed in terms of device longevity.

FIG. 1 is a flow chart showing a basic process for reliability verification adopted in the first to third embodiments. To be more precise, FIG. 1 shows a flowchart used for explaining a process or a technique for determining if a cell is likely to experience hot carrier degradation as to a component transistor, such as a MOS transistor. FIG. 2 is a view showing a basic configuration of a reliability verifying system or tool according to the first to third embodiments.

As shown in FIG. 2, the system includes a design cell library 1, a reliability library 2 for storing reliability information, a logic circuit library 3 for storing a logic-circuit database, a layout library 4 for storing a layout database, and an engineering work station (EWS) 5 acting as a reliability verification tool.

The explanation begins with the flow chart shown in FIG. 1. First of all, at a step S1 of the flowchart, a series of cells are sequentially selected to calculate their hot-carrier dependent lives from logic-circuit information, layout information and design cell library information. The flow then proceeds to a step S2 to calculate an output load of a selected cell. The output load can be defined as a count of fan-outs (FO), FO counts plus conductor lead capacity, or load output capacity. The flow then continues to a step S3 to calculate hot carrier dependent lifetime (lifetime dependent on hot carriers) of a cell or cell transistor, referring to the reliability library of the cell, and based on the calculated output load.

The flow then goes on to a step S4 to determine whether or not the calculated hot carrier dependent lifetime satisfies a predetermined reference value as to an acceptable lifetime. Besides the predetermined reference value of the hot carrier dependent lifetime, the predetermined reference value may also include a permitted amount of shift as to transistor characteristic such as the source-drain current Ids or the threshold voltage Vth. The flow then proceeds to a step S5 to record a cell with an unacceptable hot carrier degradation that constituents a hazard, i.e. a cell having a hot carrier dependent lifetime shorter than that of the predetermined reference value. In addition the recorded unreliable cell can be indicated in the logic circuit or layout. In this way, the lives of all the cells in the circuit are calculated sequentially, and those determined to have a short life expectancy because of a hot carrier reliability hazard are recorded and/or indicated.

Degradation due to hot carriers is caused typically by the following phenomena. Channel electrons each acquiring high energy from a strong horizontal electric field developed at a location in close proximity to drain generated electron-hole pairs caused by ionization resulting from collisions of the electrons with the lattice or due to avalanche multiplication, cause the electron-hole pairs to be injected into the oxide film.

When a large resulting substrate current is observed, the degradation of a cell caused by hot-carriers is severe. If the output load changes, the substrate current also changes. Consequently, the hot carrier dependent lifetime of the transistor in the cell changes as well. Further, in the case of a PMOS transistor, the gate current has an effect on the hot carrier dependent lifetime.

Figure 3:
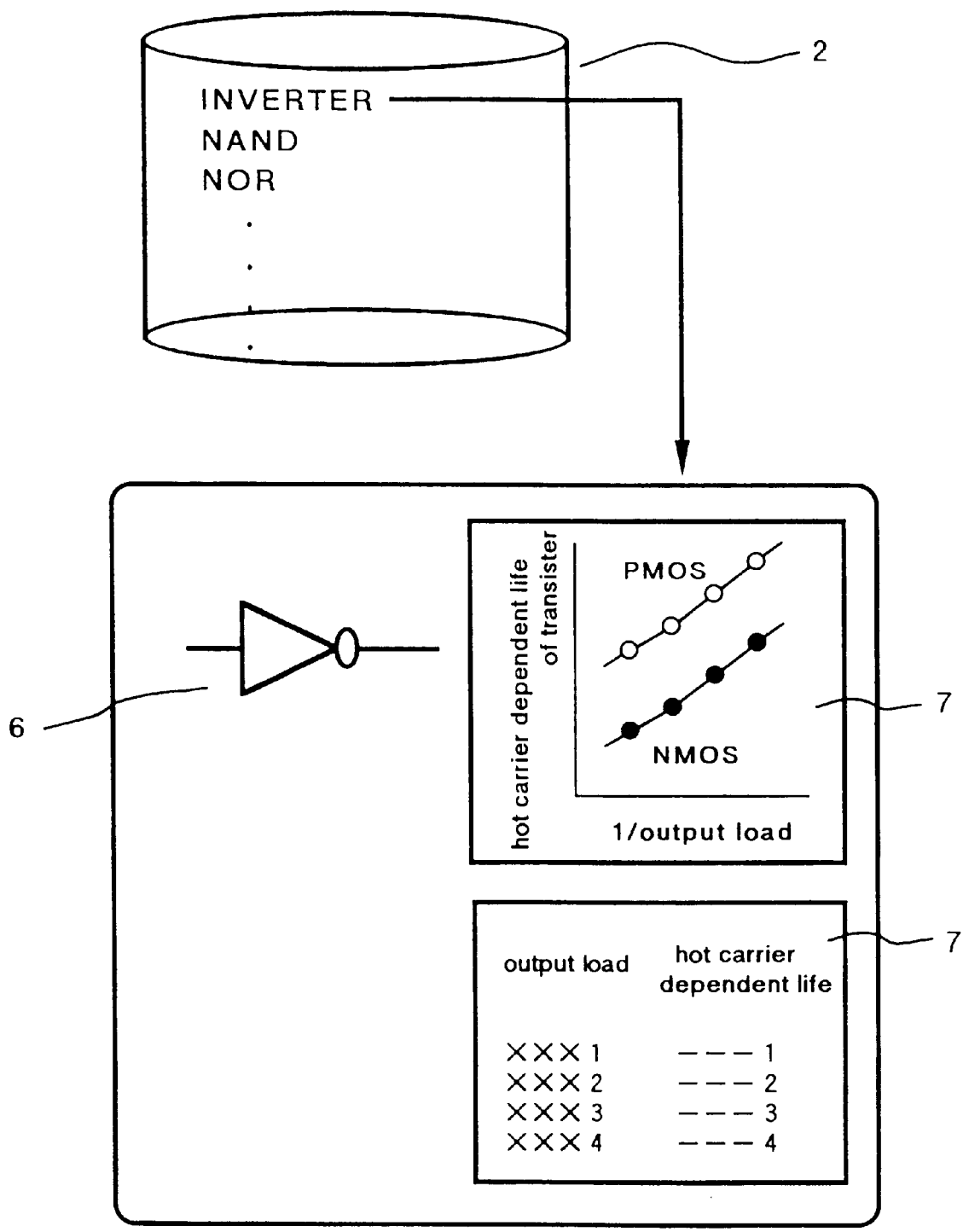
FIG. 3 is a view for explaining a typical reliability library used in some embodiments of the present invention.

FIG. 3 is a view used for explaining the reliability library 2 in the first embodiment. In the reliability library 2, a data base or file is stored which shows a relation between the output load of a cell and the hot carrier dependent lifetime of the transistor in the cell. The relation between the output load and the lifetime is obtained by calculation of the substrate current and the gate current of the transistor used in the cell from circuit simulation and by inference from experimental results on DC stress caused by hot carriers.

In FIG. 3, the reliability library 2 stores reliability information for design cells such as an inverter, a NAND gate and a NOR gate. An inverter cell 6 is illustrated as being included in the reliability library 2. A part of the stored database or file 7 includes data as to a relation between the lifetime of a cell transistor dependent on hot carrier degradation and the cell transistor output load. The relation can be stored either as a table or graphically as indicated in FIG. 3. The hot carrier dependent lifetime of a cell transistor is calculated from the information stored in the file 7 by interpolation between points or interpolation using the least-squares method.

The reliability library 2 is effectively used as a tool or process for reliability verification in the first embodiment as explained with reference to FIGS. 1 and 2. As a result, the time to determine and record a cell with a hot carrier hazard can be shortened. Accordingly, the tool or process for reliability verification can be applied to a circuit having a large scale.

Second Embodiment

Figure 4:
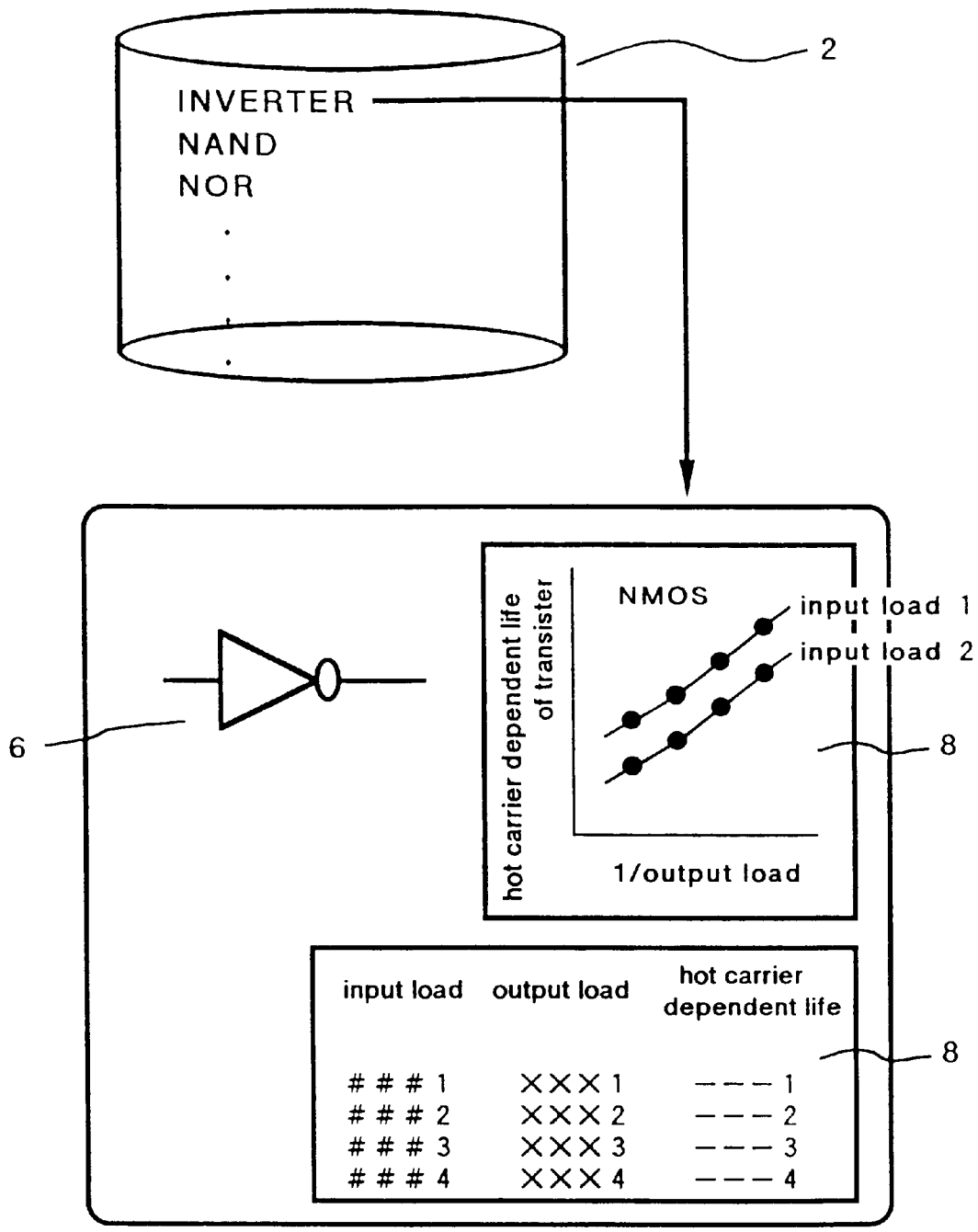
FIG. 4 is a view for explaining another typical reliability library used in some embodiments of the present invention.

A design aiding apparatus and method for the design of semiconductor devices or, in more concrete terms, a reliability verification tool and process for the design of semiconductor devices according to a second embodiment of the present invention has the same basic configuration as that shown in FIGS. 1 and 2, except that the data stored in the reliability library 2 includes a database or file for storing relationships of the hot carrier dependent lifetime of a cell transistor with respect to the input load and the output load as shown in FIG. 4.

In FIG. 4, the reliability library 2 stores reliability information of each design cell, such as an inverter, a NAND gate and a NOR gate. An inverter cell 6 is specifically shown in FIG. 4 as being included in the reliability library 2. A part of the stored data base or file 8 includes data as to a relationship between the lifetime of a cell transistor dependent on hot carrier degradation and the cell transistor input and output loads. Again, the data can be stored in table or graphic form as FIG. 4 shows.

Figure 5:
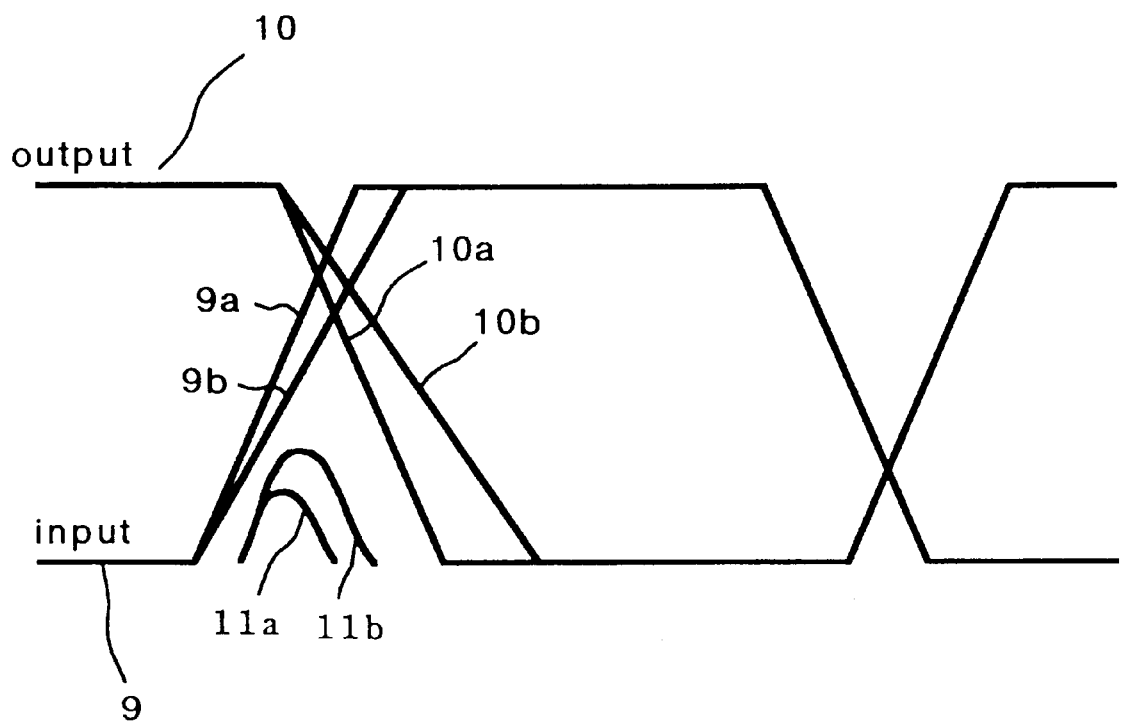
FIG. 5 is a view for explaining a relationship between input and output wave forms of a transistor and a substrate current.

FIG. 5 is a chart for explaining variations in substrate current which occur when the input and/or output loads of a cell transistor, such as the cell transistor of the inverter cell 6, changes, and an input wave form 9 and output wave form 10 change respectively. In the case of an input wave form 9 with a steep rising edge like a wave form 9a, the falling edge of the output wave form 10 is also steep as shown by a wave form 10a. In this case, the substrate current is relatively small as indicated by a wave form 11a. In the case of an input wave form 9 with a gradual rising edge like a wave form 9b, on the other hand, the falling edge of the output wave form 10 is also gradual as shown by a wave form 10b. In this case, the substrate current increases as indicated by a wave form 11b. As a result of such increased substrate current, the number of hot carriers generated in a transistor of the inverter cell 6 is large, resulting in a short transistor lifetime due to the hot carriers. As described above, if the input and/or output loads of a transistor change, the lifetime of the transistor also changes. The same thing can be said of the gate current of a PMOS transistor.

In the data base of the reliability library of the second embodiment, the input load is added as a parameter, in comparison with the data base of the reliability library of the first embodiment which stores a relation between the output load and the hot carrier dependent transistor lifetime. With the database of the reliability library of the second embodiment, estimations of hot carrier degradation can be made with an even higher degree of accuracy. By using such a reliability library in the apparatus and method for reliability verification shown in FIGS. 1 and 2, a cell having a shortened expected lifetime due to hot carrier degradation can be determined with a high degree of accuracy, and the determination time can also be reduced as well. As a result, the reliability verification apparatus and method are also applicable to a circuit of a large scale as well.

Third Embodiment

Figure 6:
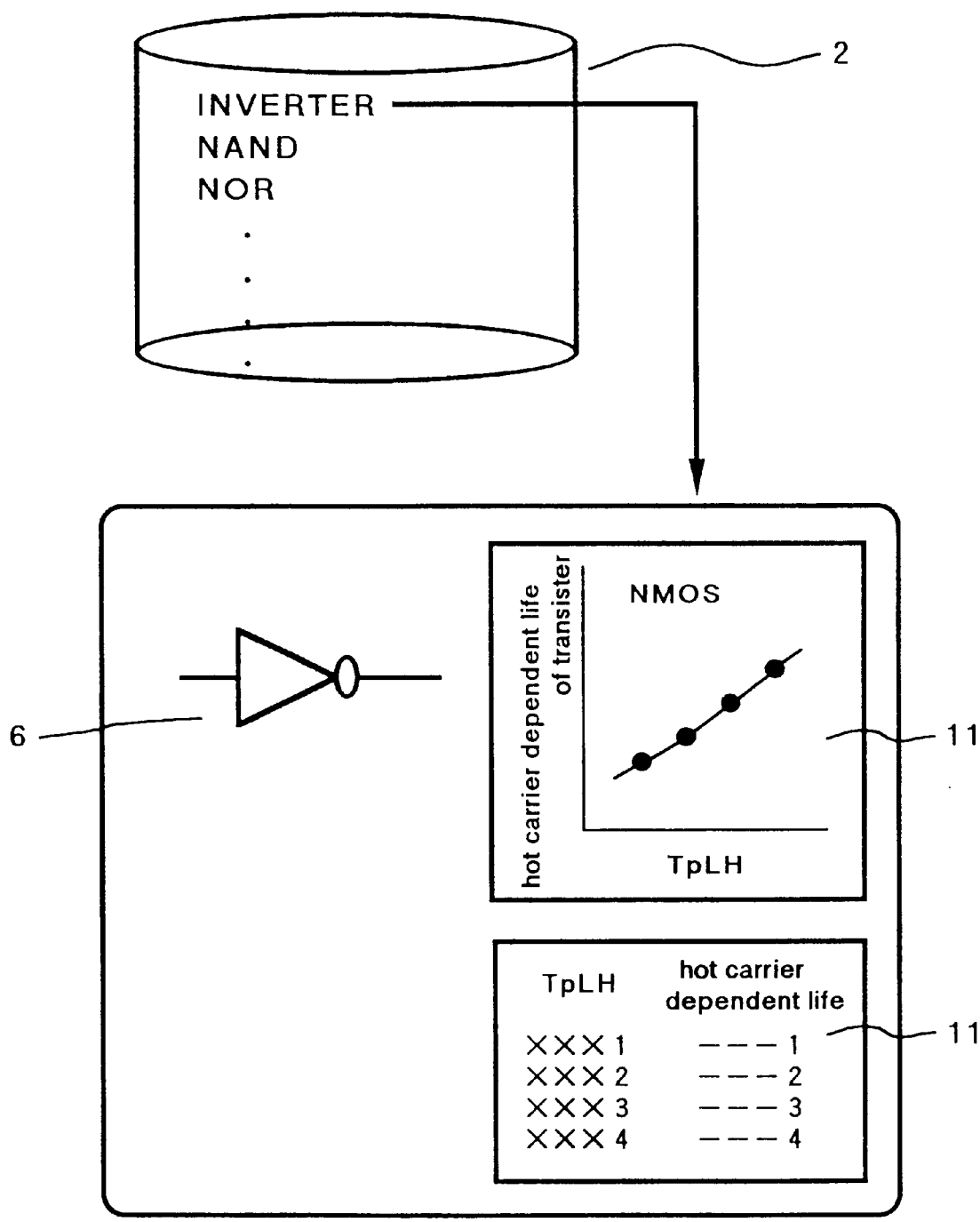
FIG. 6 is a view for explaining still another typical reliability library used in some embodiments of the present invention.

A design aiding apparatus and method for the design of semiconductor devices or, in more concrete terms, a reliability verification tool and process for the design of semiconductor devices according to a third embodiment of the present invention has the same basic configuration as that shown in FIGS. 1 and 2, except that data stored in the reliability library 2 includes a data base or file for storing a relationship between a hot carrier dependent lifetime and a propagation delay TpLH of a cell as shown in FIG. 6.

In FIG. 6, the reliability library 2 stores reliability information of a design cell, such as an inverter 6, a NAND gate and a NOR gate. A part of the stored data base or file 11 stores data as to a relation between the propagation delay TpLH of a cell and the lifetime of a cell transistor dependent on hot carriers. Once again, the data or file can be stored in table or graphic form as FIG. 6 shows.

Figure 7:
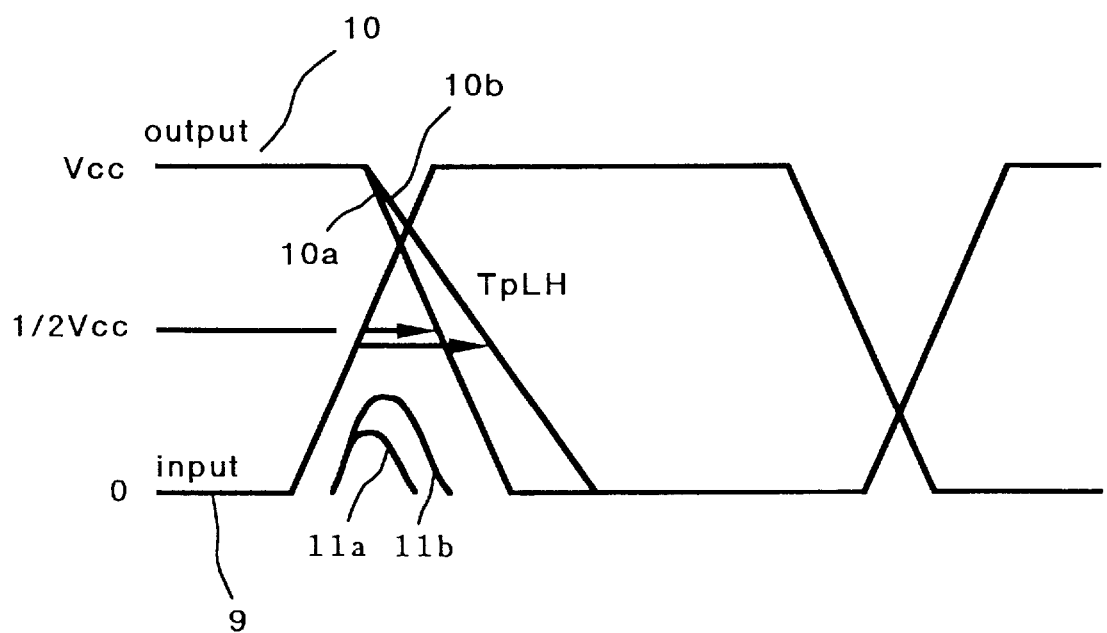
FIG. 7 is a view for explaining a relationship between input and output wave forms of a transistor and the propagation delay of a cell.

FIG. 7 is a chart for explaining variations in propagation delay TPLH which occur when the output load of a cell, such as the inverter cell 6, changes, and an input wave form 9 and output wave form 10 changes respectively. In the case of a small output load, the falling edge of the output wave form 10 for the input wave form 9 is steep as shown by a wave form 10a. In this case, the substrate current is relatively small as indicated by a wave form 11a. In the case of a large output load, on the other hand, the falling edge of the output wave form 10 for the input wave form 9 is gradual as shown by a wave form 10b. In this case, the substrate current increases as indicated by a wave form 11b. As a result, the number of hot carriers generated in a transistor of the inverter cell 6 is large, resulting in a short transistor lifetime due to the hot carriers. As described above, if the input and/or output loads of a transistor change, the lifetime of the transistor also changes. As seen in FIG. 7, hot carrier degradation is affected by a large substrate current, and in the case of an inverter cell, that happens during the input and output transition periods.

By using such a reliability library in the tool and method for reliability verification as shown in FIGS. 1 and 2, the time to determine a cell with a shortened lifetime due to expected hot carrier degradation can be reduced. As a result, this reliability verification tool and method are also applicable to a circuit having a large scale.

Fourth Embodiment

Figure 8:
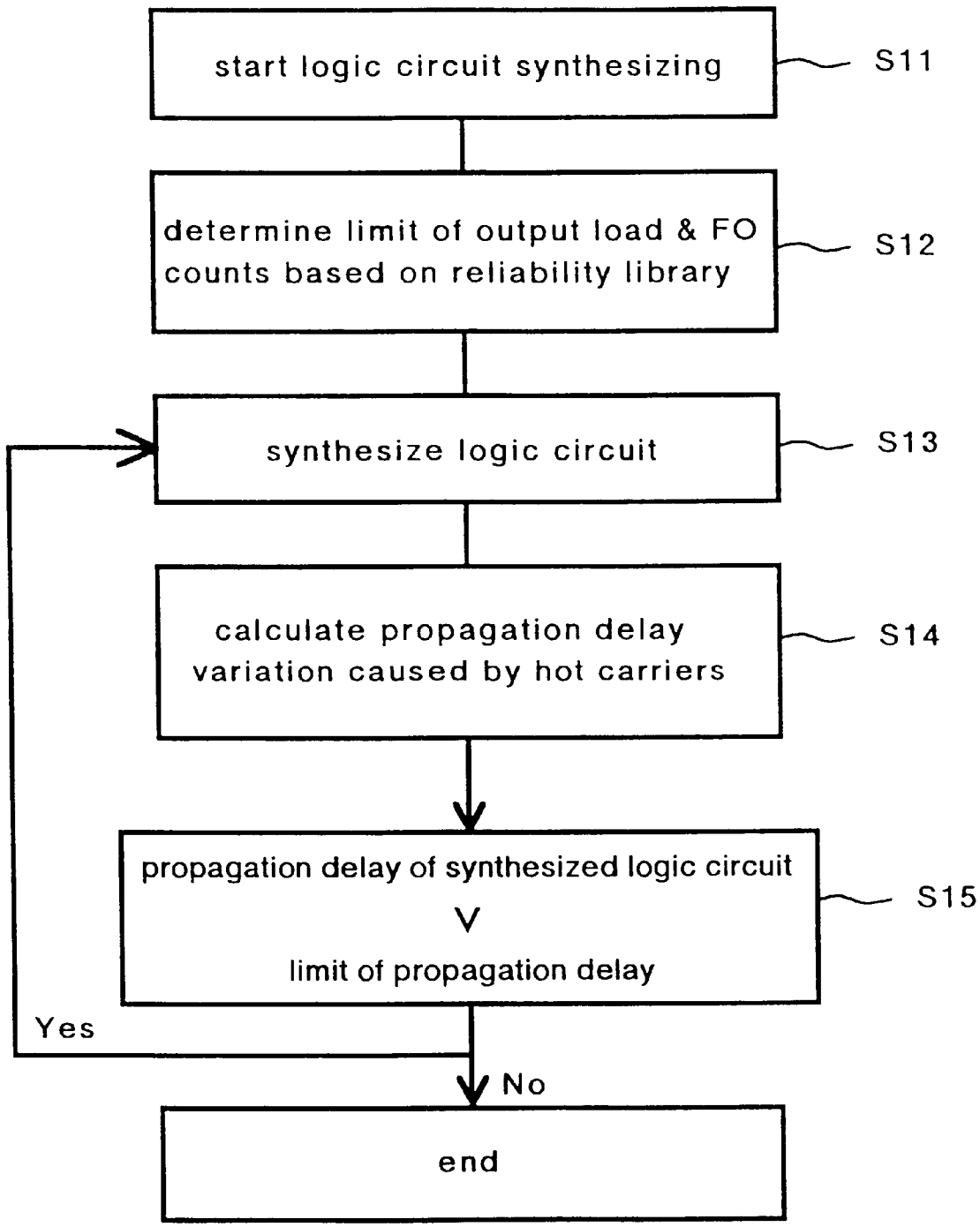
FIG. 8 shows a flowchart for explaining a design aiding apparatus and method, or in more concrete terms, a reliability verifying tool and process to be used in the design of semiconductor devices according to fourth to sixth embodiments of the present invention.
Figure 9:
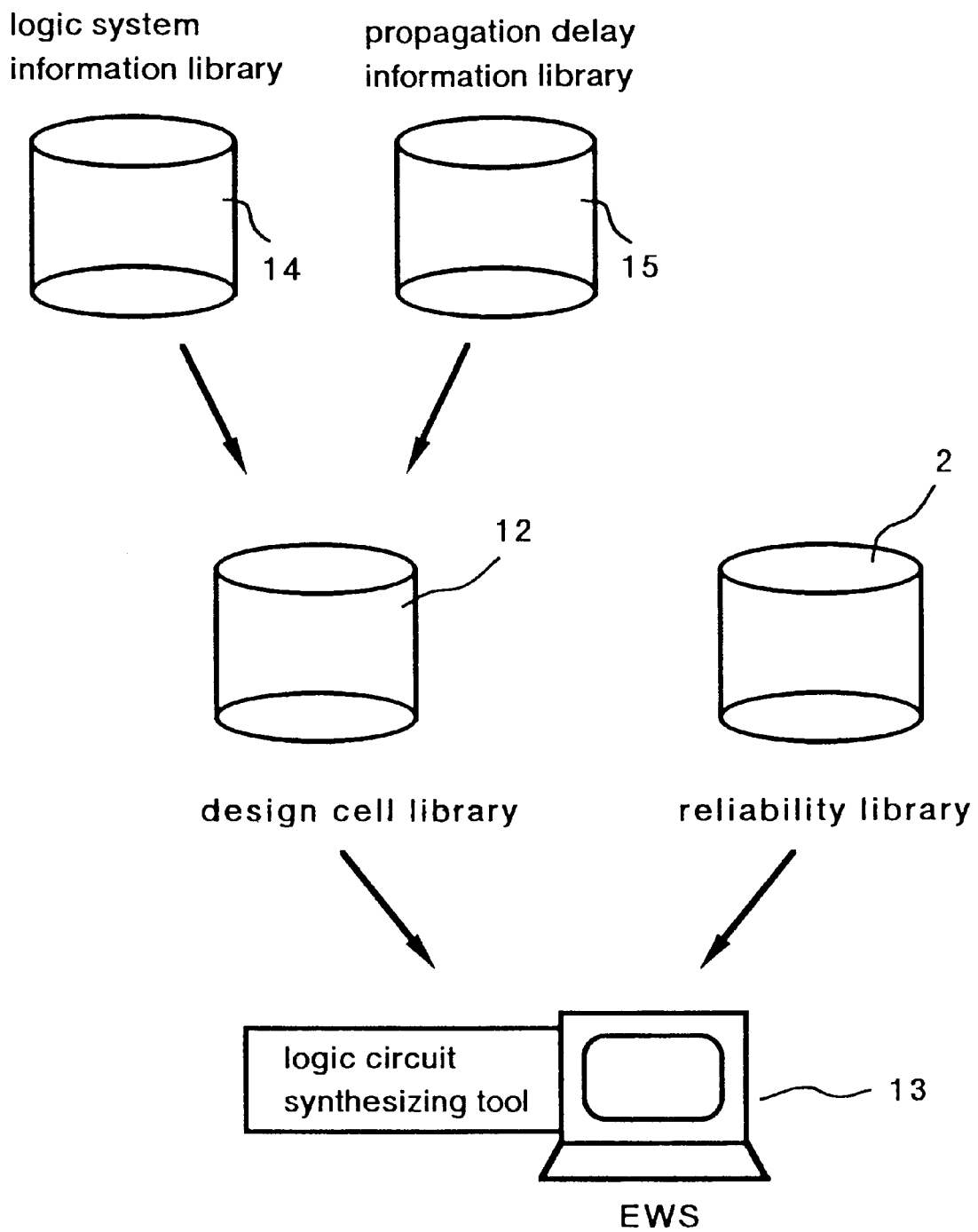
FIG. 9 is a view for explaining a configuration of a design aiding apparatus and method, or in more concrete terms, a reliability verifying tool and process to be used in the design of semiconductor devices according to fourth to sixth embodiments of the present invention.

FIGS. 8 and 9 are views for explaining a design aiding apparatus and method for the design of semiconductor devices according to fourth to sixth embodiments of the present invention. To put it in more concrete terms, FIGS. 8 and 9 are views for explaining a logic-circuit synthesizing tool and process serving as a design aiding apparatus and method for synthesizing logic circuits in the design of a semiconductor device.

FIG. 8 is a chart showing the basic process of logic-circuit synthesis adopted by the fourth to sixth embodiments, and FIG. 9 is a view showing a basic configuration of a logic-circuit synthesizing apparatus according to the fourth to sixth embodiments. In FIG. 9, a design cell library 12 stores a data base of design data. The design library 12 includes a logic-system information library 14 and a propagation-delay information library 15. In addition,, an Engineering work station (EWS) 13 is used for logic-circuit synthesis. A reliability library 2 stores a reliability data base.

Normally, the EWS 13 for logic-circuit synthesis automatically generates a logic circuit that satisfies a desired operational speed by using data stored in the design library 12 such as logic-system information and propagation-delay information of each cell.

The reliability library 2 is included in the present invention shown in FIG. 9, and stores reliability information of each cell. As shown in FIG. 8, at a step S11, the logic-circuit synthesis is started. The flow then goes on to a step S12 to set the limit in quantities such as the output load or the number of FOs of each cell so that each cell can have a longer lifetime than a predetermined reference lifetime. The flow then proceeds to a step S13 at which a logic-circuit synthesis is carried out. If a logic-circuit has to be synthesized with a fan-out count exceeding the output load limit value during the logic-circuit synthesis, a variation in propagation delay caused by hot carriers needs to be calculated at a step S14.

The flow then proceeds to a step S15 to examine whether the propagation delay of the synthesized logic-circuit obtained from this logic-circuit synthesis is smaller than the limit of the propagation-delay. Thus, the logic-circuit synthesis is performed. In this way, according to the present invention, the EWS 13 synthesizes a logic-circuit based on information stored in the reliability library 2, while also providing for a predetermined reference lifetime with regard to expected hot carrier effects while also minimizing the propagation delay of the synthesized logic circuit.

In the fourth embodiment, a file containing a relation between a hot carrier dependent lifetime and an output load shown in FIG. 3 is used as the reliability library 2. By doing so, a logic-circuit can be synthesized in a short time by limiting the output load of each cell so as to provide for a reference lifetime with regard to expected hot carrier effects. As a result, the design aiding apparatus and method can also be applied to a circuit of a large scale, and a circuit is obtained with designed reliability as to freedom from excessive hot carrier degradation for an expected lifetime.

Fifth Embodiment

The design aiding apparatus and method for the design semiconductor devices or, in more concrete terms, a logic-circuit synthesizing tool and process useful in the design of semiconductor devices according to a fifth embodiment has the same basic configuration as shown in FIGS. 8 and 9, except for the difference that, in the case of the fifth embodiment, the reliability library 2 is a file for storing relationships of the hot carrier dependent lifetime with respect to an input load and output load as shown in FIG. 4.

In this way, a logic-circuit can be synthesized in a short time, while limiting the output load of each cell and minimizing the propagation delay of the synthesized circuit so as to provide for an expected lifetime of operation free from the effects of hot carrier degradation. As a result, the design aiding apparatus and method can also be applied to a circuit of a large scale to obtain a circuit having an expected lifetime free from the effects of hot carrier degradation.

Sixth Embodiment

A design aiding apparatus and method for the design of semiconductor devices, or in more concrete terms, a reliability verifying tool and process for use in the design of semiconductor devices according to a sixth embodiment of the present invention has the same basic configuration as that shown in FIGS. 8 and 9, except for a difference that, in the case of the sixth embodiment, the reliability library 2 is a file for storing a relation between the hot carrier dependent lifetime and the propagation delay TpLH as shown in FIG. 6.

In this way, a logic-circuit can be synthesized in a short time, while limiting an output load of each cell and minimizing the propagation delay of the synthesized circuit so as to provide an expected lifetime of operation without hot carrier degradation. As a result, the design aiding apparatus and method can also be applied to a circuit of large scale to obtain a circuit having the expected lifetime free from the effects of hot carrier degradation.

Seventh Embodiment

Figure 10:
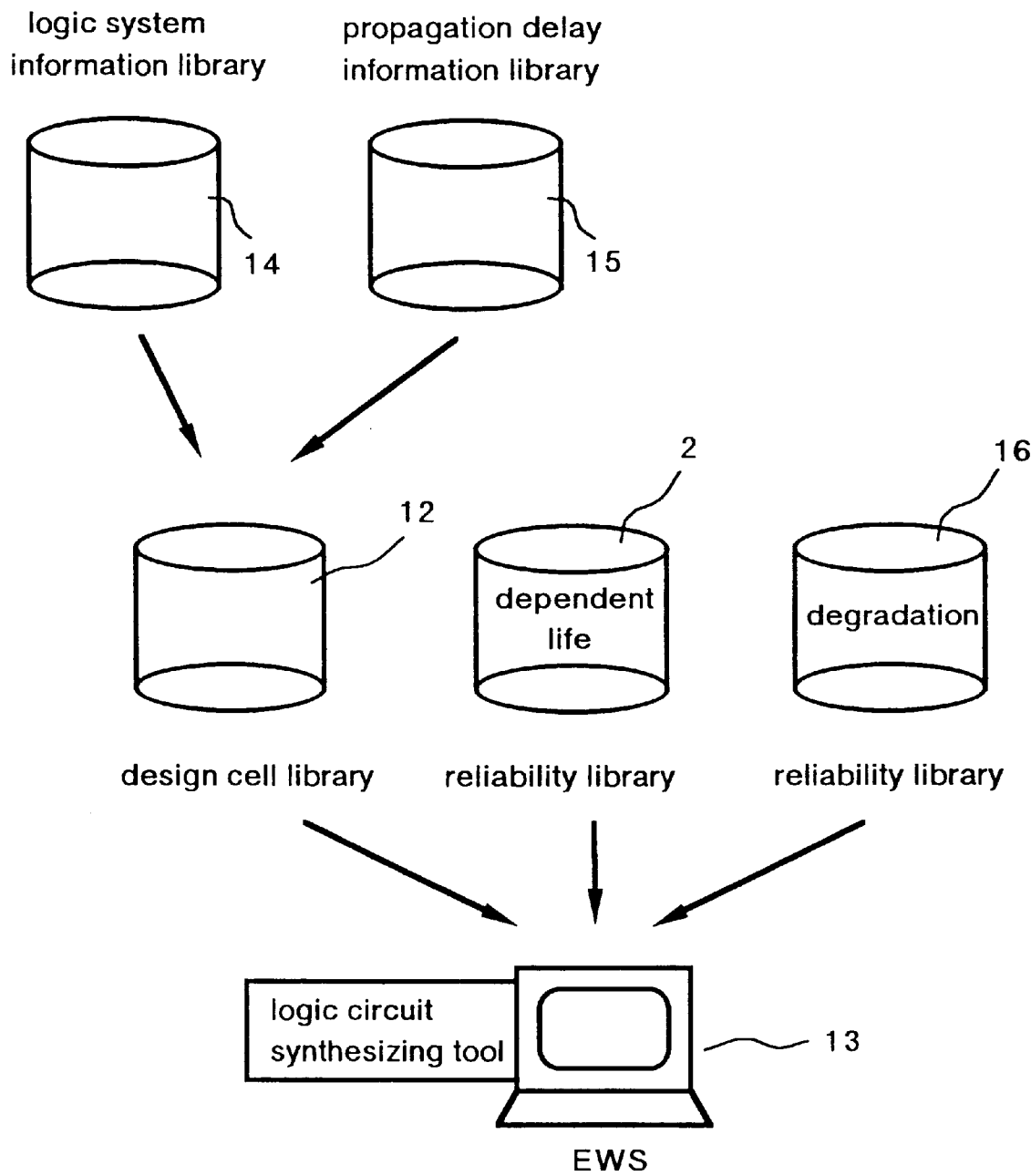
FIG. 10 is a view for explaining a configuration of a design aiding apparatus and method, or in more concrete terms, a reliability verifying tool and process to be used in the design of semiconductor devices according to seventh to ninth embodiments of the present invention.

FIG. 10 is a chart for explaining a design aiding apparatus and method to aid in the design of semiconductor devices according to seventh to ninth embodiments of the present invention. In more concrete terms, FIG. 10 is a chart for explaining a logic-circuit synthesizing tool and a logic-circuit synthesizing process serving as a design aiding apparatus and method for use in the design of semiconductor devices according the seventh to ninth embodiments of the present invention. The basic process of the logic-circuit synthesis adopted in the seventh to ninth embodiments is shown in FIG. 8. FIG. 10 shows the basic configuration of the logic-circuit synthesizing tool in the seventh to ninth embodiments.

In FIG. 10, a design cell library 12 stores a data base of design data. The design library 12 includes a logic-system information library 14 and a propagation-delay information library 15. Further, an engineering work station (EWS) 13 synthesizes a logic-circuit. A first reliability library 2 stores a reliability data base as to a relationship between the hot carrier dependent lifetime and the output load of each cell. A second reliability library 16 stores a reliability data base as to an increase in propagation delay with respect to an output load of each cell and degradation caused by hot carriers.

Normally, EWS 13 automatically synthesizes a logic-circuit that provides a desired operational speed by using data stored in the design library 12 such as propagation-delay information of each cell and logic system information.

Further, the reliability library 2 in the present invention shown in FIG. 10 stores reliability information for cell. With reference to FIG. 8, logic-circuit synthesis is started at at step S11. The flow then goes on to a step S12 to set the limit values of quantities such an the output load or a number of FOs of each cell so that the cell can have a predetermined reference lifetime. The flow then proceeds to a step S13 at which a logic-circuit synthesis is carried out.

If a logic has to be synthesized with a fan-out count exceeding the output load limit value during the logic-circuit synthesis, a variation in propagation delay caused by excessive hot carriers is calculated at a step S14. The flow then proceeds to a step S15 to examine whether the propagation delay of the synthesized logic circuit obtained from this logic-circuit synthesis satisfies a propagation-delay limit. To be more specific, at the step S15, in the case of the seventh to ninth embodiments, information as to a relationship between the increase in propagation delay (that is, the amount of degradation) caused by hot carriers and the output load of each cell is read in from the data base of the reliability library 16 shown in FIG. 10. The total propagation delay of the synthesized logic-circuit, which is a sum of the propagation delay of the circuit path and the propagation delay caused by hot carriers, is verified to satisfy a propagation-delay limit as to an acceptable operation time. In this way, according to the present invention, the EWS 13 carries out the synthesis of a logic circuit based on information stored in the reliability library 2, while providing for an expected lifetime due to hot carrier degradation while minimizing the propagation delay of the synthesized logic circuit which is a sum of the propagation delay of the circuit path and the propagation delay caused by hot carrier degradation as described above.

In addition, in the case of seventh embodiment, a file containing a relationship between a hot carrier dependent lifetime and an output load shown in FIG. 3 is used as the reliability library 2. Thereby, a logic circuit can be synthesized in a short time, while limiting an output load of each cell, so as to have a lifetime as long as a reference lifetime even with hot carrier degradation.

As described above, a logic circuit can be synthesized in a short time taking into account any increases in circuit propagation delay due to degradation caused by hot carriers. As a result, the design aiding apparatus and method can also be applied to circuit of a large scale, and a circuit can be obtained with desired characteristics as to propagation delays and lifetime. It should be noted that, for the sake of simplification, re-synthesizing of a logic circuit due to an increase in a circuit propagation delay caused by hot carriers may be applied only to critical paths.

Eighth Embodiment

The design aiding apparatus and method for the design of semiconductor devices or, in more concrete terms, a logic-circuit synthesizing tool and process for the synthesizing of semiconductor devices according to the eighth embodiment have the same basic configurations as those shown in FIGS. 8 and 10, except for the difference that, in the case of the eighth embodiment, the reliability library 2 is a file for storing each relationship of hot carrier dependent lifetime with respect to an input load and an output load as shown in FIG. 4.

In this way, a logic circuit can be synthesized in a short time, while limiting an output load of each cell, and minimizing a propagation delay of a synthesized circuit taking into account the effects of hot carrier degradation. As a result, the design aiding apparatus and method can also be applied to a circuit of a large scale and a circuit with a lifetime as long as a reference lifetime even with some hot carrier effects can be obtained.

Ninth Embodiment

A design aiding apparatus and for the design method of semiconductor devices or, in more concrete terms, a reliability verifying tool and process for the synthesizing of semiconductor devices according to the ninth embodiment of the present invention which has the same basic configuration as that shown in FIGS. 8 and 10, except for a difference that, in the case of the ninth embodiment, the reliability library 2 is a file for storing a relation between a hot carrier dependent lifetime and a propagation delay TpLH as shown in FIG. 6.

In this way, a logic circuit can be synthesized in a short time, while limiting an output load of each cell, and minimizing a propagation delay of a synthesized circuit taking into account the effects of hot carrier degradation. As a result, the design aiding apparatus and method can also be applied to a circuit of a large scale, and a circuit with a lifetime as long as a reference lifetime even with some hot carrier effects can be obtained.

Tenth Embodiment

Figure 11:
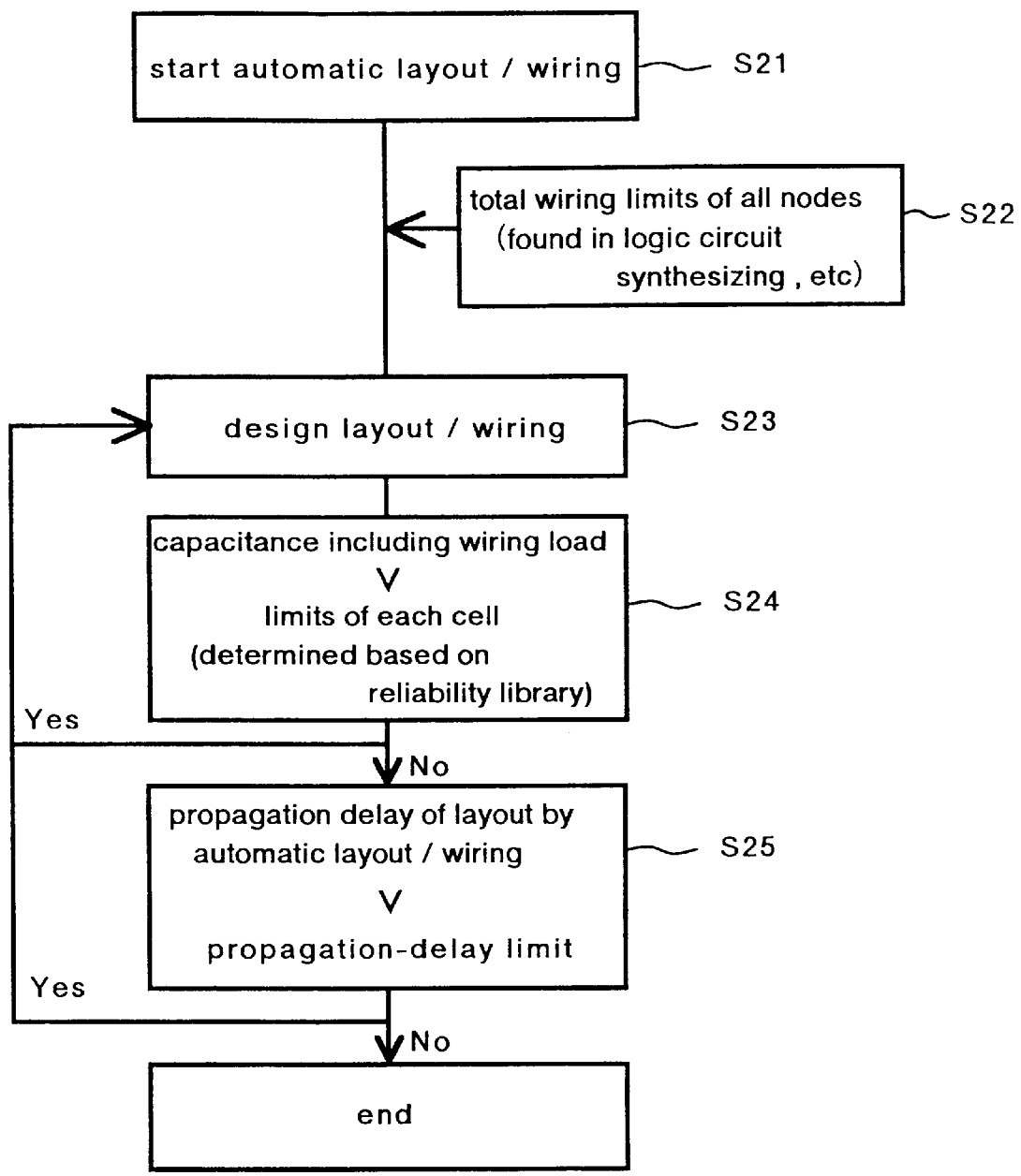
FIG. 11 shows a flowchart for explaining a design aiding apparatus and method, or in more concrete terms, an automatic layout and/or wiring tool and process to be used in the design of semiconductor devices according to tenth to twelfth embodiments of the present invention.
Figure 12:
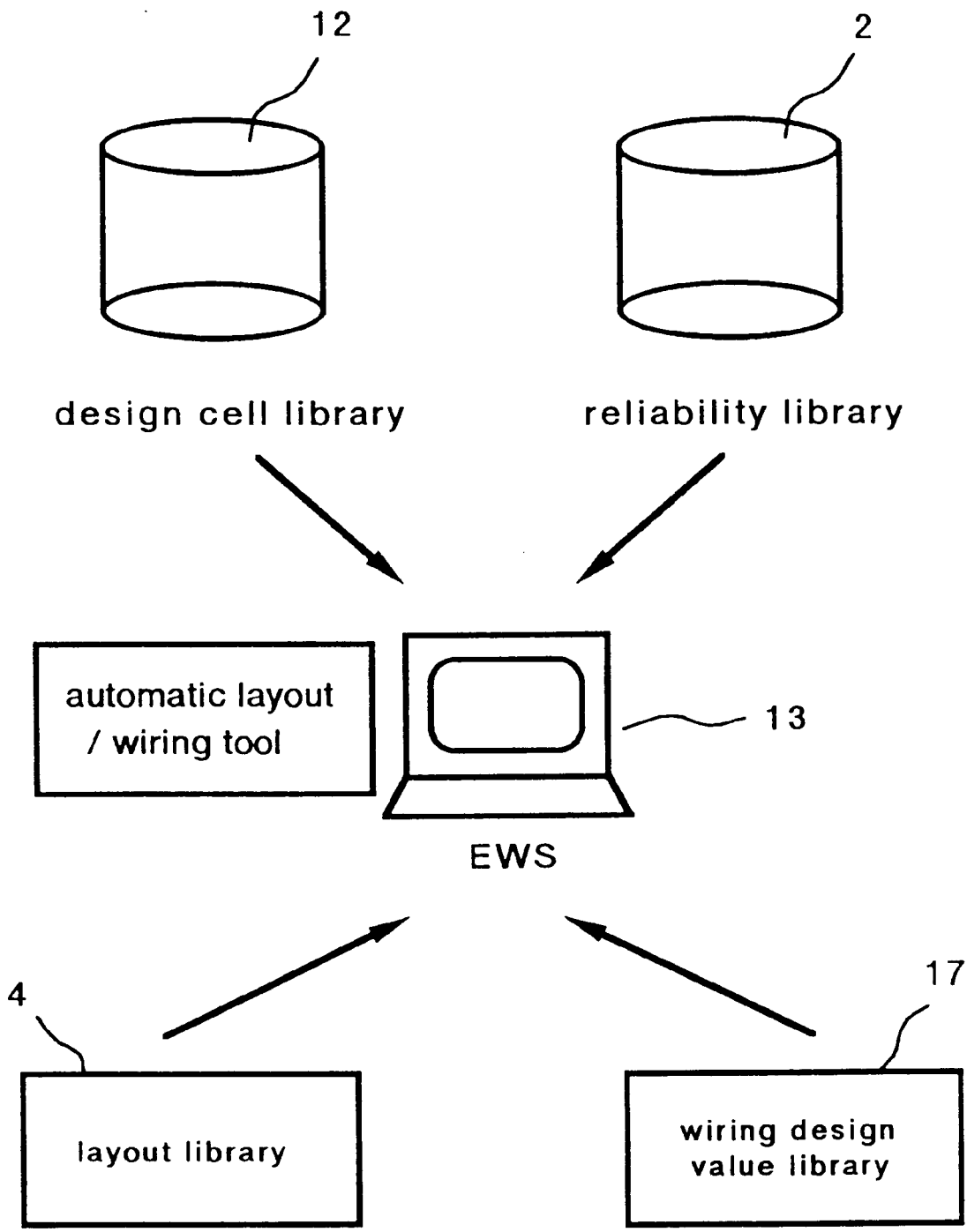
FIG. 12 is a view for explaining a configuration of a design aiding apparatus and method, or in more concrete terms, the automatic layout/wiring tool and process to be used in the design of semiconductor devices according to the tenth to twelfth embodiments of the present invention.

FIGS. 11 and 12 are charts for explaining a design aiding apparatus and method for the design of semiconductor devices according to tenth to twelfth embodiments of the present invention. In more concrete terms, FIGS. 11 and 12 are charts for explaining an automatic layout/wiring tool and process serving as a design aiding apparatus and method for designing a layout and/or wiring of semiconductor devices according to the tenth to twelfth embodiments of the present invention.

FIG. 11 is a chart showing a basic process of performing an automatic layout and/or wiring operations, while FIG. 12 is a view showing a basic configuration of the automatic layout/wiring tool according to the tenth to twelfth embodiments. In FIG. 12, a reliability library 2 stores a reliability data base, and a layout library 4 stores a layout data base. A design cell library 12 stores a data base of design data.

Further, an Engineering work station (EWS) 13 is used for automatic layout/wiring design. A wiring design-value library 17 stores wiring design data such as the lead widths and hole diameters.

The automatic layout/wiring operation is carried out normally based on design data stored in the design cell library 12 such as logic circuit information synthesized by a logic circuit synthesizing tool, and further based on cell layout data from the layout library 4, and wiring design data such as the lead widths and hole diameters from the wiring design-value library 17. A wiring is thus designed, and a layout is thus determined so as satisfy a desired operational reference speed and reference area.

According to the present invention, the automatic design of the layout/wiring is started at a step S21 shown in FIG. 11. The flow then goes on to a step S22 to refer total wiring limits of all nodes found in logic circuit synthesizing or in same other way. The flow then proceeds to a step S23 to design a layout of cells and wiring within the total wiring limit set at the step S22. The flow then continues to a step S24 to verify that a capacitance including wiring load is smaller than a limit of output load of each cell or other limit determined by information from the reliability library 2. The flow then goes on to a step S25 to verify that the propagation delay of the layout resulting from the automatic layout/wiring design carried out in this manner is smaller than the propagation-delay limit.

In this way, according to the present invention in which the reliability library 2 is provided, layout/wiring can be designed automatically by using information on reliability of each cell stored in the reliability library 2, while taking into account a minimum predetermined lifetime to be maintained relative to hot carrier degradation while minimizing the propagation delay of the logic circuit being laid out.

Further, in the case of the tenth embodiment, a file containing a relation between a hot carrier dependent lifetime and an output load shown in FIG. 3 is used as the reliability library 2. By doing so, layout/wiring can be designed automatically by limiting the output load of each cell so as to satisfy the minimum predetermined lifetime requirement by protecting each cell against excessive degradation caused by hot carriers. As a result, the design aiding apparatus and method can also be applied to a circuit of a large scale with an expected life as long as the minimum predetermined reference lifetime even in the presence of some hot carrier effects can be obtained.

Eleventh Embodiment

A design aiding apparatus and method of semiconductor devices or, in more concrete terms, an automatic layout/wiring tool and process for the design of semiconductor devices according to the eleventh embodiment of the present invention which has the same basic configuration as that shown in FIGS. 11 and 12, except for the difference that, in the case of the eleventh embodiment, the reliability library 2 is a file for storing a relationship between a hot carrier dependent lifetime and an input and output loads as shown in FIG. 4.

In this way, layout/wiring can be designed by limiting input and output loads of each cell and minimizing the propagation delay of the designed layout/wiring so as to secure a minimum predetermined reference lifetime by protecting each cell against excessive degradation caused by hot carriers. As a result, the design aiding apparatus and method can also be applied to a circuit of large scale with an expected life as long as the minimum predetermined reference lifetime even in the presence of some hot carrier effects.

Twelfth Embodiment

A design aiding apparatus and method for the design of semiconductor devices or, in more concrete terms, an automatic layout/wiring tool and an automatic layout/wiring process of semiconductor devices according to the twelfth embodiment of the present invention which as the same basic configuration as that shown in FIGS. 11 and 12, except for the difference that, in the case of the twelfth embodiment, the reliability library 2 is a file for storing a relationship between a hot carrier dependent lifetime and a propagation delay TpLH as shown in FIG. 6.

In this way, layout/wiring can be designed by limiting the input and output loads of each cell and minimizing the propagation delay of the designed layout/wiring so as to satisfy the minimum predetermined reference lifetime by protecting the cell against excessive degradation caused by hot carriers. As a result, the design aiding apparatus and the design aiding method can also be applied to a circuit of a large scale with an expected life as long as the minimum predetermined reference lifetime even in the presence of some hot carrier effects can be obtained.

Thirteenth Embodiment

Figure 13:
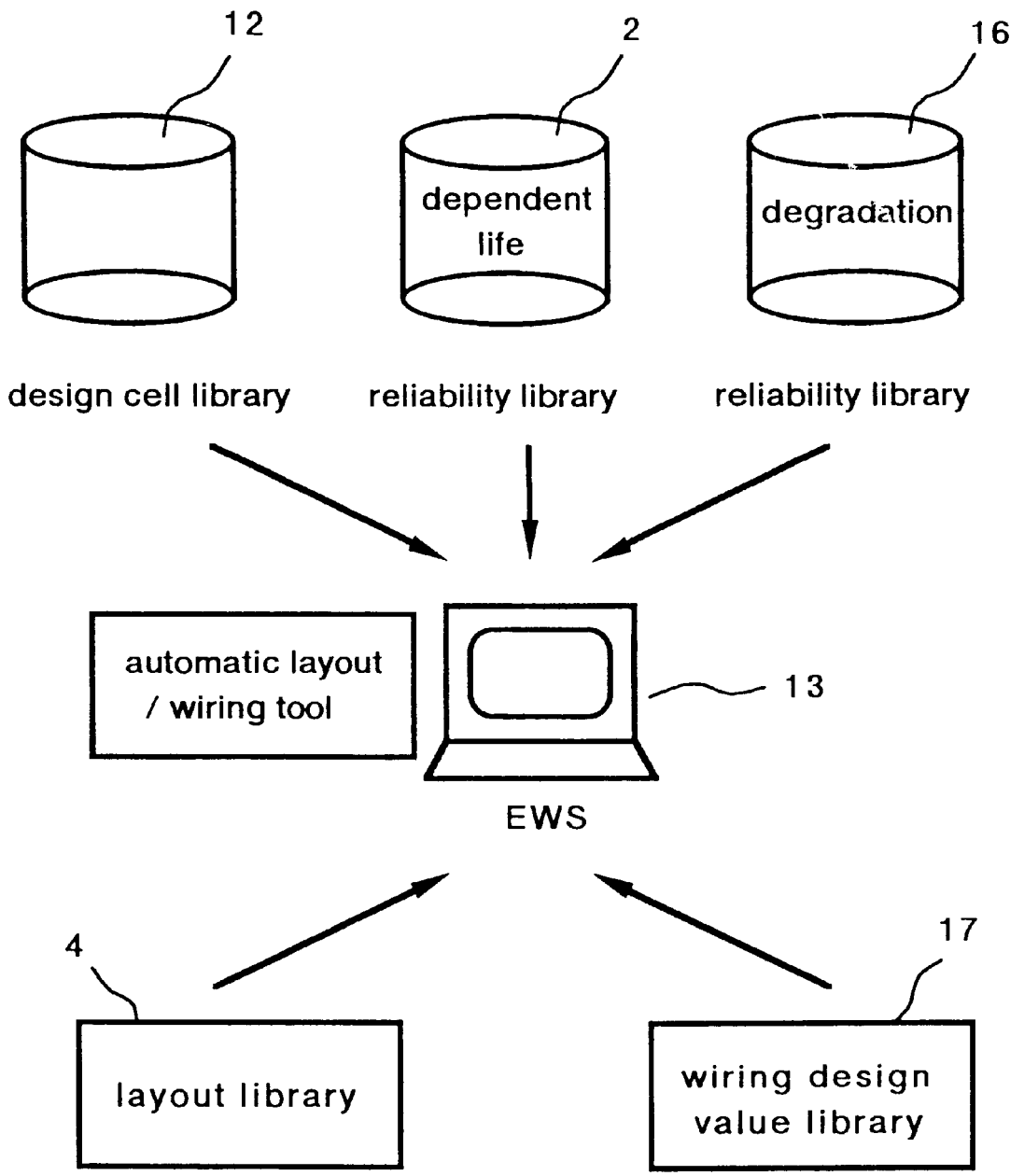
FIG. 13 is a view for explaining a configuration of a design aiding apparatus and method, or in more concrete terms, the automatic layout/wiring tool and process to be used in the design of semiconductor devices according to thirteenth to fifteenth embodiments of the present invention.

FIG. 13 is a view for explaining a design aiding apparatus and method for the design of semiconductor devices according to thirteenth to fifteenth embodiments of the present invention. In more concrete terms, FIG. 13 is a view for explaining another automatic layout/wiring tool and automatic layout/wiring process serving as a design aiding apparatus and method for designing layout and/or wiring of semiconductor devices according to the thirteenth to fifteenth embodiments of the present invention. A basic process of performing the automatic layout/wiring operations in the thirteenth to fifteenth embodiments is similar to that shown by FIG. 11.

In FIG. 13, a layout library 4 stores a layout data base, and a design cell library 12 stores a data base of design data. An engineering work station (EWS) 13 provides for automatic layout/wiring. A wiring design-value library 17 stores wiring design data such as the lead widths and hole diameters. Further, a first reliability library 2 stores a first reliability data base, i.e. a data base of a relationship between a hot carrier dependent lifetime and input and output loads of each cell, while a second reliability library 16 stores a second reliability data base, i.e. a data base of an increase in propagation delay for each cell corresponding to an output load and hot carrier degradation.

The automatic layout and/or wiring operation is carried out normally based on design data stored in the design library 12 such as a logic circuit information synthesized by the logic-circuit synthesizing tool, and further based on cell layout data from the layout library 4, and wiring design data such as the width of each lead and diameter of each hole from the wiring design-value library 17. Thus, layout and/or wiring determined so as to satisfy a desired operational reference speed and area.

According to the present invention, the automatic design of the layout and/or wiring is started at a step S21 shown in FIG. 11. The flow then goes on to a step S22 to refer to total wiring limit of all nodes found in the logic circuit synthesizing or the like. The flow then proceeds to a step S23 to design a layout and wiring of a cell within the total wiring limit set at the step S22. The flow then continues to a step S24 to verify that a capacitance including wiring load is smaller than a load limit of each cell determined by information from the reliability library 2. The flow then goes on to a step S25 to verify that the propagation delay of the layout resulting from the automatic layout and/or wiring design carried out in this way is smaller than the propagation-delay limit. To be more specific, at the step S25, in the case of the thirteenth to fifteenth embodiments, information on the increase in propagation delay (that is, the amount of degradation) corresponding to hot carriers and the output load of each cell is read in from the reliability data base of the reliability library 16 shown in FIG. 13. The propagation delay of the logic circuit by an automatic layout/wiring design, which is the sum of the propagation delay of the circuit path and the propagation delay caused by hot carriers, is checked to ensure that it is within the propagation-delay limit. In this way, according to the present invention, layout/wiring can be designed automatically by using information on reliability of each cell stored in the first reliability library 2 and the second reliability library 16 while taking into account a minimum predetermined reference lifetime to be maintained as to hot carrier degradation effects while minimizing the propagation delay of the logic circuit being laid out.

In addition, in the case of thirteenth embodiment, a file containing a relation between a hot carrier dependent lifetime and an output load shown in FIG. 3 is used as the reliability library 2. By doing so, layout/wiring can be designed automatically in a short time, while limiting the output load of each cell so as to maintain the minimum predetermined reference lifetime requirement by protecting each cell against excessive hot carrier degradation effects.

As described above, it is possible to design layout/wiring in a short time including a circuit propagation delay due to degradation caused by hot carriers. As a result, the design aiding apparatus and method can also be applied to a circuit of a large scale with an expected life as long as the minimum predetermined reference lifetime even in the presence of some hot carrier degradation effects. It should be noted that, for the sake of simplification, redesigning of a layout and/or wiring due to an increase in a circuit propagation delay caused by hot carriers may be applied only to critical paths.

Fourteenth Embodiment

A design aiding apparatus and method for the design of semiconductor devices or, in more concrete terms, an automatic layout/wiring tool and process for the design of semiconductor devices according to the fourteenth embodiment of the present invention which has the same basic configuration as that shown in FIGS. 11 and 13, except for the difference that, in the case of the fourteenth embodiment, the reliability library 2 is a file for storing a relationship between a hot carrier dependent lifetime and input and output loads as shown in FIG. 4.

In this way, layout and/or wiring can be designed in a short time, while limiting input and output loads of each cell and minimizing the propagation delay of the designed layout and/or wiring while taking into account a minimum predetermined reference lifetime to be maintained relative to hot carrier degradation. On top of that, information on an increase in propagation delay (that is, the amount of degradation), which is related to an output load of the cell and hot carrier degradation, is read in from the data base of the reliability library 16. And, layout and/or wiring can be designed automatically in a short time, while minimizing the propagation delay, which is the sum of the propagation delay of the circuit path and the propagation delay caused by hot carriers. As a result, the design aiding apparatus and method can also be applied to a circuit of a large scale with an expected life as long as the minimum predetermined reference lifetime even in the presence of some hot carrier degradation effects.

Fifteenth Embodiment

A design aiding apparatus and method for the design of semiconductor devices or, in more concrete terms, an automatic layout and/or wiring tool and process for the design of semiconductor devices according to the fifteenth embodiment of the present invention which has the same basic configuration as that shown in FIGS. 11 and 13, except for the difference that, in the case of the fifteenth embodiment, the reliability library 2 is a file for storing a relation between a hot carrier dependent lifetime and a propagation delay TpLH as shown in FIG. 6.

In this way, layout and/or wiring can be designed, while limiting the input and output loads of each cell and minimizing a propagation delay of the designed layout and/or wiring so as to secure a minimum predetermined reference lifetime while protecting the cell against excessive degradation due to hot carriers. Further, the information on the increase in propagation delay (that is, the amount of degradation) caused by hot carriers and the output load of the cell is read in from the data base of the reliability library 16. Then, layout and/or wiring can be designed automatically in a short time, while minimizing the propagation delay, which is a sum of the propagation delay of a circuit path and a propagation delay caused by hot carriers. As a result, the design aiding apparatus and method can also be applied to a circuit of a large scale to provide it with a minimum expected lifetime in terms of avoiding excessive propagation delays arising from excessive hot carrier degradation.

As described above in detail, according to the present invention, a design aiding apparatus and method for designing semiconductor devices is provided which can be applied to obtain large scale devices having a minimum expected lifetime before the onset of excessive hot carrier degradation.

Obviously many modifications and variations of the present invention are possible in the light of the above teachings. It is therefore to be understood that within the scope of the appended claims the invention may by practiced otherwise than as specifically described.

What is claimed as new and is desired to be secured by Letters Patent of the United States is:

1. A design aiding apparatus for designing a semiconductor device having a plurality of cells, comprising:

a design cell information library for the designing of said semiconductor device;

a logic-circuit information library for the designing of said semiconductor device;

a layout information library for the designing of said semiconductor device;

a reliability information library indicating the expected lifetime of said design cells; and a processing means for carrying out predetermined design and reliability processing based on information said processing means obtains from said libraries, wherein said processing means calculates an output load for a selected cell based on information obtained by said processing means from at least one of said design cell information library, said logic-circuit information library and said layout information library;

wherein said processing means also calculates a hot carrier dependent lifetime for a transistor in said design cell by using said computed output load and information said processing means obtains from said reliability information library; and wherein said processing means verifies reliability of said cell by comparing said calculated hot carrier dependent lifetime with a reference value.

2. A design aiding apparatus for designing a semiconductor device according to claim 1, wherein said reliability information library comprises a first stored information library showing a relationship between an output load of each said design cell and said hot carrier dependent transistor lifetime, a second stored information library showing a relationship between input and output loads of each said design cell and said hot carrier dependent transistor lifetime, or a third stored information library showing a relationship between a propagation delay from an input wave form to an output wave form for each said design cell and said hot carrier dependent transistor lifetime.

3. A design aiding apparatus for designing a semiconductor device according to claim 2, wherein said third stored information library showing a relationship between said propagation delay from an input wave form to an output wave form for each said design cell and said hot carrier dependent transistor expected lifetime includes information on increases in propagation delay due to degradation caused by hot carriers.

4. A design aiding apparatus for designing a semiconductor device having a plurality of cells, comprising:
   a logic system information library for designing said semiconductor device;
   a propagation delay information library for designing said cells;
   a reliability information library for designing said cells; and
   a processing means for carrying out predetermined design processing based on information said processing means obtains from said libraries,
   wherein said processing means designs a logic circuit semiconductor device having a predetermined operational speed based on information said processing means obtains from said logic system information library and said propagation delay information library, wherein said processing means further designs said logic circuit to have an expected lifetime taking into account expected hot carrier degradation, based on information said processing means obtains from said reliability information library.

5. A design aiding apparatus for designing a semiconductor device according to claim 4, wherein said reliability information library comprises at least one of an information library showing a relation between an output load of each said design cell and a hot carrier dependent transistor lifetime, an information library showing a relation between input and output loads of each said design and said hot carrier dependent transistor lifetime, and an information library showing a relation between a propagation delay from an input wave form to an output wave form of each said design cell and said hot carrier dependent transistor lifetime.

6. A design aiding apparatus for designing a semiconductor device according to claim 5, wherein said information library showing a relation between said propagation delay from an input wave form to an output wave form of each said design cell and said hot carrier dependent transistor lifetime includes information on increases in propagation delay due to degradation caused by hot carriers.

7. A design aiding apparatus for designing a semiconductor device having a plurality of cells, comprising:
   a design library for designing said semiconductor device;
   a layout information library for designing said semiconductor device;
   a reliability information library for determining reliability of said cells; and
   a processing means for carrying out predetermined design processing based on information said processing means obtains from said libraries,
   wherein said processing means determines initial wiring based on information said processing means obtains from said layout information library and information said processing means obtains from said design library to provide wiring capable of operating at a desired operating speed;
   and performs automatic layout/wiring based on information the processing means obtains from said reliability information library to design a cell having a desired operating speed for a desired lifetime despite hot carrier degradation.

8. A design aiding apparatus of a semiconductor device according to claim 7, wherein said reliability information library comprises at least one of an information library showing a relationship between an output load of each cell and a hot carrier dependent transistor lifetime, an information library showing a relationship between input and output loads of each cell and a hot carrier dependent transistor lifetime, and an information library showing a relation between a propagation delay from an input wave form to an output wave form of each cell and a hot carrier dependent transistor lifetime.

9. A design aiding apparatus of a semiconductor device according to claim 7, wherein said information library showing a relationship between a propagation delay from an input wave form to an output wave form of each cell and a hot carrier dependent transistor lifetime includes information on increases in propagation delay due to degradation caused by hot carriers.

10. A design aiding method for designing semiconductor devices having a plurality of cells, said method comprising the steps of:
    computing an output load for a selected cell by using at least one of design cell information, logic circuit information and layout information;
    computing a hot carrier dependent transistor lifetime relative to said selected cell by using said computed output load and reliability information for said selected cell; and
    comparing said computed hot carrier dependent transistor lifetime with a reference value,
    whereby the reliability of each said selected cell is verified relative to said reference value.

11. A design aiding method for designing semiconductor devices according to claim 10, wherein said reliability information comprises at least one of information as to a relationship between an output load each said selected cell and a stored hot carrier dependent transistor lifetime, information on a relationship between input and output loads of each said selected cell and said stored hot carrier dependent transistor lifetime, or information as to a relationship between a propagation delay from an input wave form to an output wave form of each said selected cell and said stored hot carrier dependent transistor lifetime.

12. A design aiding method for designing semiconductor devices according to claim 11, wherein said information as to a relationship between a propagation delay from an input wave form to an output wave form of each said selected cell and said stored hot carrier dependent transistor lifetime includes information on increases in propagation delay due to degradation caused by hot carriers.

13. A design aiding method for designing semiconductor devices having a plurality of cells, comprising a step of determining logic circuit design by using logic system information and propagation-delay information so as to at least initially satisfy an operational circuit speed requirement and by using reliability information so as to ensure that each of said cells in said logic circuit has a minimum expected lifetime in view of detrimental circuit speed degradation caused by hot carriers.

14. A design aiding method for designing semiconductor devices according to claim 13, wherein said reliability information comprises at least one of information as to a relationship between an output load of each said cell and a hot carrier dependent cell transistor lifetime, information as to a relationship between input and output loads of each said cell and said hot carrier dependent cell transistor lifetime, or information as to a relationship between a propagation delay from an input wave form to an output wave form of each cell and said hot carrier dependent transistor lifetime.

15. A design aiding method for designing semiconductor devices according to claim 13, wherein said information as to a relationship between said propagation delay from said input wave form to said output wave form of each said cell and said hot carrier dependent transistor lifetime includes information on increases in propagation delay due to degradation caused by hot carriers.

16. A design aiding method for designing semiconductor devices having a plurality of cells, comprising the steps of setting an initial wiring by using information derived from design layout information, performing final automatic layout and/or wiring by using reliability information so as to incorporate into cells connected by said wiring an operational design speed capability that takes into account hot carrier degradation effects as to speed.

17. A design aiding method of semiconductor devices according to claim 16, wherein said reliability information comprises at least one of information as to a relationship between an output load of each cell and a hot carrier dependent transistor lifetime, information as to a relationship between input and output loads of each cell and a hot carrier dependent transistor lifetime, and information as to relationship between a propagation delay from an input wave form to an output wave form of each cell and a hot carrier dependent transistor lifetime.

18. A design aiding method of semiconductor devices according to claim 16, wherein said information as to a relationship between a propagation delay from an input wave form to an output wave form of each cell and a hot carrier dependent transistor lifetime includes information on increases in propagation delay due to degradation caused by hot carriers.

* * * * *